United States Patent [19]

Baylac et al.

[11] Patent Number: 5,187,631
[45] Date of Patent: Feb. 16, 1993

[54] PRECHARGER FOR SHORT CIRCUIT DETECTOR

[75] Inventors: Brunno Y. H. Baylac, Toulouse; Michel Castel, Aucamville, both of France

[73] Assignee: Siemens Aktiengesellschaft, Munich, Fed. Rep. of Germany

[21] Appl. No.: 357,261

[22] Filed: May 26, 1989

[30] Foreign Application Priority Data

May 26, 1988 [FR] France .................. 88 07005

[51] Int. Cl.⁵ .................. H02H 3/093; H02J 15/00
[52] U.S. Cl. .................. 361/94; 307/246;
307/109; 320/1; 323/901; 361/110
[58] Field of Search .......... 261/87, 93, 94, 98,
261/101, 152-154, 187, 205, 18, 92, 110;
323/284, 282, 274, 901, 351; 307/10.1, 10.7,
354, 246, 109; 340/650, 663; 324/503, 509, 510;
320/1

[56] References Cited

U.S. PATENT DOCUMENTS

| | | | |
|---|---|---|---|
| 3,733,540 | 5/1973 | Hawkins | 363/89 |
| 4,016,461 | 4/1977 | Roland | 361/18 |
| 4,106,498 | 8/1978 | Haney | 128/2.05 |
| 4,423,457 | 12/1983 | Brajder | 361/98 |
| 4,430,682 | 2/1984 | Bassch | 361/101 X |
| 4,574,232 | 3/1986 | Petty | 323/268 |
| 4,816,963 | 3/1989 | Eden | 361/101 |

FOREIGN PATENT DOCUMENTS 2152305 12/1984 United Kingdom .

Primary Examiner—A. D. Pellinen
Assistant Examiner—David Osborn
Attorney, Agent, or Firm—Hill, Steadman & Simpson

[57] ABSTRACT

A circuit for controlling the power supply of an electrical load, having a device for detecting a short-circuit of the load. The detection device has a comparator which supplies a signal representative of a short-circuit state of the load when the voltage at the terminals of that load, after filtering, is below a reference voltage Vref. The device has a circuit for rapidly pre-charging a capacitor of the filter, when the load is switched on. The initial time interval during which the output signal of the comparator is not representative of the presence or absence of a short-circuit is thus reduced. The circuit is applicable to the control of actuators in motor vehicle electronics.

17 Claims, 2 Drawing Sheets

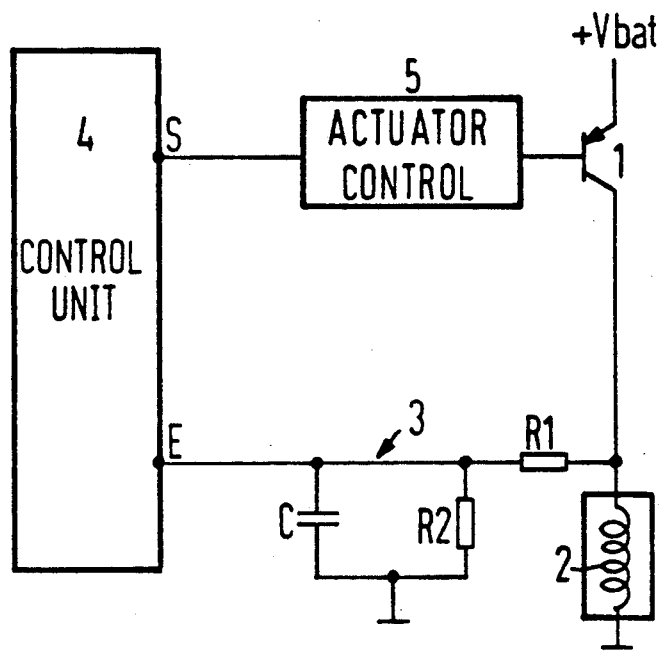
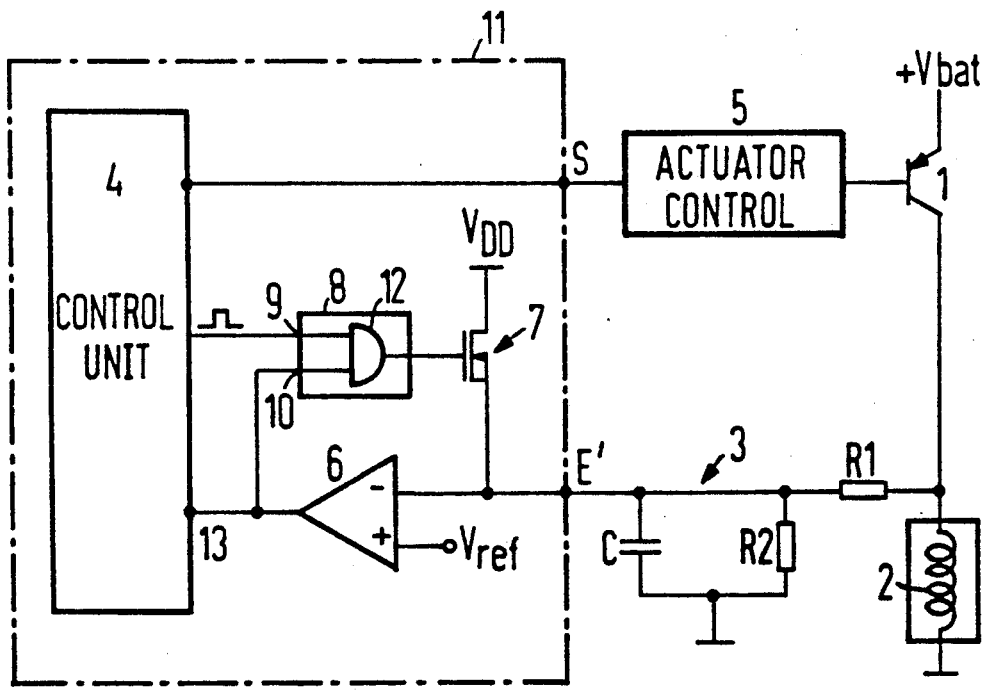

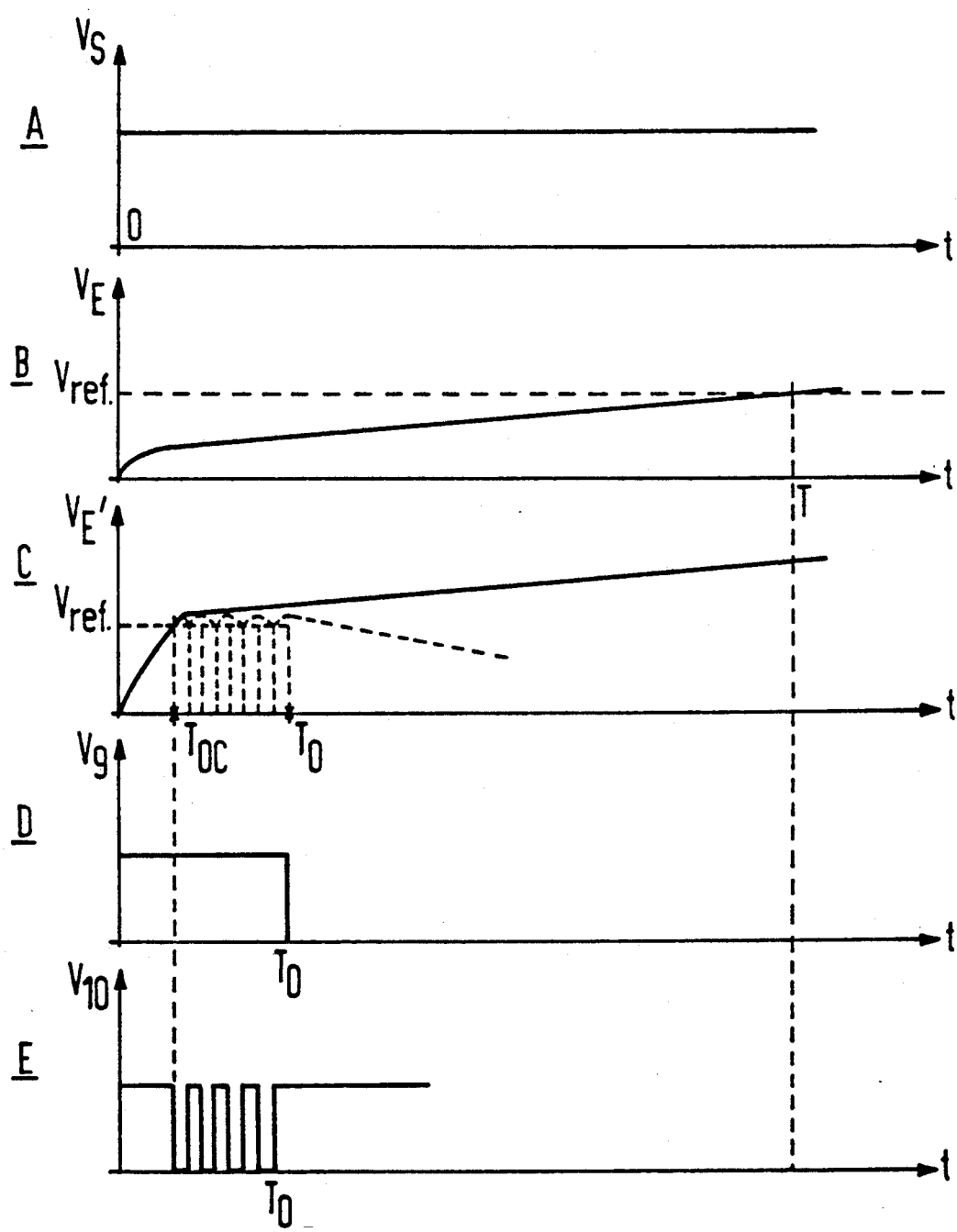

PRECHARGER FOR SHORT CIRCUIT DETECTOR

BACKGROUND OF THE INVENTION

The present invention relates to a circuit for controlling the power supply of an electrical load provided with a device for detecting a short-circuit of the load. More particularly, the invention relates to a circuit for controlling the power supply of an inductive load whose detecting device monitors the possible short-circuiting of the load in order that a corrective action may be triggered. Damage is thereby prevented, for example, damage to the circuit by a short-circuit of the load or defective functioning of a unit having this load.

In motor vehicle electronics, numerous actuators have such inductive loads. Such inductive loads are the winding of a fuel injector or that of an electromechanical valve for varying the pressure of a braking fluid in an antilocking device for the wheels of a vehicle. The inductive load may also be the coil of an inductive primary ignition circuit.

The circuits controlling such inductive loads in a motor vehicle environment are often fitted with diagnostic means enabling the detection, for example, of a disconnection or an accidental short-circuit of the inductive load which renders the latter inoperative, this detection being made for reasons of safety for example. These means are electronic circuits which monitor the voltage existing at the terminals of the load in order to detect, for example, the possible appearance of a short-circuit and to trigger alarms or appropriate corrective actions.

Considering the high interference environment of a motor vehicle, the voltage sampled at the terminals of the load must be filtered in order that it may be used, the filtered signal being compared with a reference voltage. When the filtered signal is below this reference voltage, the means used for comparison supplies a signal representative of a short-circuited state of the load.

FIG. 1 of the drawings shows a prior art circuit for controlling the power supply of an actuator having an inductive load. The circuit has a power transistor 1 controlled by its base in order to initiate the power supply of an inductive load 2 connected in series with the emitter-collector circuit of the power transistor 1, between the collector of the transistor 1 and ground. In the circuit shown, the power supply voltage +Vbat is supplied by the battery of a motor vehicle. As has been explained above, a filter 3, for example a low pass capacitive filter, takes the voltage from the terminal which is common to the inductive load 2 and the collector of the transistor 1 in order to filter out the interference from this signal before applying it to an input E of a control unit 4 which is designed to use the signal received from the filter 3. The unit 4 also controls the conduction of the power transistor 1 via a terminal S connected to the base of this transistor, through an actuator control sub-circuit 5.

When the control unit triggers this conduction, the capacitor C of the low pass filter 3 begins to charge with a certain time constant. In FIG. 3 of the accompanying drawing, there is shown at A the control signal Vs of the transistor 1 output at S by the control unit, and at B, the voltage $V_E$ at the terminals of the capacitor. Up to the point in time T where $V_E$ reaches a value Vref of a reference voltage generated by the control unit 4 in order to derive, from a comparison of the voltage at the terminals of the load 2 after filtering with this voltage Vref, the presence or absence of a short-circuit of this load, the comparison is not significant since the voltage at the terminals of the load is constantly lower than Vref, even in the absence of a short-circuit.

It is therefore necessary to provide a means for preventing the control unit from taking into account an short-circuit information u to the point in time T.

In order to do this it is possible to consider generating a delay of the output signal of the filter by analog or digital means. When the control unit is a microprocessor, the delay is obtained by means of a parallel loaded counter which is initialized by the microprocessor. Using this assumption, the voltage signal at the terminals of the load could also be filtered by a digital means.

The masking logic necessary for obtaining a digital delay has the disadvantage of being expensive. In fact, the delay to be generated must in practice be able to reach values in the order of 200 μs which, for a resolution of 2 μs, involves the use of a parallel loaded 7-bit counter in order to be programmable. A requirement which additionally requires a 7-bit register and the associated logic. This assembly requires the integration of about 200 MOS transistors per counter resulting in an expensive production.

Such a solution does not however provide a reduction in the length of the time interval during which a short-circuit of the load cannot be detected. As described above, the generated delay must in practice be in the order of 200 μs, whereas experience shows that a short-circuit of the load for more than 100 μs which is not taken into account can affect the safety of the control circuit of the power supply of this load.

SUMMARY OF THE INVENTION

It is an object of the present invention to provide a circuit for controlling the power supply of an electrical load, having a device for detecting a short-circuit of the load, this circuit being provided with a means which reduces to a minimum the duration during which a possible short-circuit of the load cannot be detected by the device.

Another object of the present invention is to provide an integrated circuit which is less expensive than that of the digital masking means set forth above.

Another object of the present invention is to provide such a device in which the characteristics of the device for detecting a short-circuit of the load are independent of those of the filter used for removing interference from the voltage sampled at the terminals of the load. Such a circuit is thus easily adapted to a modification of this filter.

These objects of the invention, as well as others which will appear below, are achieved with a circuit for controlling the power supply of an electrical load, having a device for detecting a short-circuit of the load by comparison of a reference voltage with a voltage sampled at the terminals of the load and filtered in a capacitive filter. The circuit is characterized by a means, actuated by the switching on of the electrical load, for precharging a capacitor of the filter in order to initially establish on the output of this capacitor a voltage substantially equal to the reference voltage. The time constant of the charging of the capacitor by these means is low with respect to that which corresponds to the charging of this capacitor by the supply voltage of the load alone.

These pre-charging means have a connecting transistor for connecting the capacitor of the filter to a pre-charging voltage source and a logic sub-circuit for triggering the conduction of the transistor when the load is switched on.

In one embodiment of the circuit according to the present invention, the comparison of the reference voltage with the voltage sampled a the terminals of the load is performed by a comparator whose inputs respectively receive these voltages. The logic sub-circuit then consists of a logic AND gate having two inputs respectively connected to the output of the comparator and to a source of a validation signal of predetermined duration, the output of the AND gate connected to a control terminal of the connecting transistor.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several FIGS. in which like reference numerals identify like elements, and in which:

FIG. 1 is a diagrammatic representation of a prior art circuit for controlling the power supply of an electrical load, provided with a device for detecting a short-circuit of the load;

FIG. 2 is a diagrammatic representation of a circuit according to the present invention for controlling the power supply of an electrical load, provided with a device for detecting a short-circuit of the load; and FIG. 3 shows graphs of the variations in time of voltages sampled in the circuits of FIGS. 1 and 2, these graphs illustrating the operation of the circuit according to the present invention.

DESCRIPTION OF THE PREFERRED EMBODIMENT

Referring now to FIG. 2 of the drawings the circuit shown uses various elements of the prior art circuit of FIG. 1 as explained above. In FIGS. 1 and 2 identical numbers denote identical or similar devices.

In FIG. 2, a power transistor 1 controls the electrical power supply of a load 2. The transistor 1 can be a transistor of the MOS technology type, or of the bipolar technology type as shown in FIG. 2 in which it takes the form of a PNP type transistor connected by its emitter to the positive terminal of an electrical power supply source. In motor vehicle electronics, this power supply source is the battery of the vehicle which supplies a voltage +Vbat. The load 2, typically an inductive winding in motor vehicle electronics, is in this case part of an actuator, for example, an electromechanical valve which varies the pressure for the flow rate of a fluid. Such an electromechanical valve can initiate a supply of liquid fuel at a given time, or cut off this supply at a given time.

Safety reasons lead to the monitoring of the correct operation of such an actuator and, for this purpose, the detecting of a possible disconnection or short-circuiting of its winding.

For short-circuit detection, there is conventionally provided, as described above, a device which samples the voltage at the terminals of the load 2 and which compares this voltage with a reference voltage Vref. When the sampled voltage is less than Vref it can be concluded that the load is short-circuited. The device then generates a signal processed by a control unit 4 for triggering corrective actions.

The control unit typically has one or more microprocessors, memories and interfaces which receive signals from sensors monitoring values associated with the functioning of the vehicle: engine intake pressure, speed of rotation of the engine, temperature of the air or of a cooling liquid etc... These signals are processed by the unit 4 which generates control signals for actuators which enable the adjustment of certain operating parameters for example. Thus the control unit 4 generates at its output S a signal for triggering the conduction or non-conduction of the transistor 1 via a control sub-circuit 5 of the actuator of which the inductive load 2 is a part.

In motor vehicle electronics, in particular, the environment produces high levels of interference. The short-circuit device detection must therefore be supplied by a signal from which the interference has been filtered out and which represents the voltage at the terminals of the load. For this purpose there is conventionally used a low pass capacitive filter 3 which has, for example, a capacitor C and a resistor R2 connected in parallel between the ground and one terminal of a resistor R1 whose other terminal is connected to the point common to the load 2 and the collector of the power transistor 1. At the point E', which is the point common to the capacitor C and to the resistor R1, there is available a voltage signal which is free of interference and which is compared with the voltage Vref in a comparator 6 in order to detect the presence of a possible short-circuit of the load.

When the control unit triggers by means of the actuator control 5 and the transistor 1, the power supply will also cause the charging of the capacitor C, through the resistor R1, with a time constant determined by the values of the resistors R1 and R2 and of the capacitor C.

If what then occurs in the circuit of the prior art shown in FIG. 1 is examined in conjunction with Graph B in FIG. 3, which shows the variation of the voltage at the output E of the filter of this circuit starting from the switching on at t=0 of the load 2 and triggered by the signal Vs applied to the control unit 4 at its output S, it can be seen that the voltage at E increases until it reaches at a point in time T, the value Vref. At the value Vref control unit 4 of the circuit in FIG. 1 compares the filtered voltage in order to derive, in the case of the filtered voltage exceeding this value, the absence of any short-circuit of the load 2.

Up to the point in time T, with the filtered voltage remaining below Vref, the detection device could confuse this situation with that resulting from a genuine short-circuit, even in the absence of such a short-circuit of the load.

In order to avoid such an erroneous detection, a masking of the information provided by the detection device is provided up to the point in time T. In order to do this, it is possible to use an analog delay or digital masking means such as described above. The latter are expensive and do not solve the problem of the detection device not supplying significant information up to the point in time T.

If the load is already short-circuited at the point in time t=0, or if a short-circuit occurs between t=0 and t=T, it is clear that the detection device of the circuit in FIG. 1 is not capable of indicating this short-circuit before the point in time T because of the masking.

In motor vehicle electronics a value on the order of 200 μs is usually observed for the duration of the interval [0, T], taking into account the time constant of the filter necessary for a good removal of interferences from the voltage signal sampled at the load.

Now it has been observed that a short-circuit which remains uncorrected for more than about 100 μs could inflict damage on the circuit.

According to the present invention such a situation is prevented by providing the detection device of the circuit with a means, shown in FIG. 2, which provides for the time interval during which a short-circuit of the load cannot be indicated by the detection device to be reduced to only a few microseconds.

These means consist of a voltage source $V_{DD}$ connected by means of a connection transistor 7 to the output terminal of the filter 3. The transistor 7 can, for example, be of the N channel MOS type, the source of the transistor being connected to the capacitor C, at the output of the filter, while the drain is connected to the voltage source $V_{DD}$. The gate of the transistor is controlled by the output of a pre-charging control logic sub-circuit 8, this sub-circuit 8 having two inputs 9 and 10 respectively connected to the control unit 4 and to the output of the comparator 6.

The transistor 7, the sub-circuit 8 and the comparator 6 can be integrated with the control unit in order to form a single integrated circuit 11 controlling via its output terminal S the switching on of the load 2, and receiving at its input terminal E' the filtered voltage signal sampled at the terminals of this load. This integrated circuit can of course have other input and/or output terminals in order to receive or to supply signals processed in the control unit for monitoring purposes or for the control of other functions.

The circuit according to the prevent invention therefore operates as follows. When the control unit supplies on its output terminal S a signal commanding the switching on of the load 2, this unit simultaneously sends to the input terminal 9 of the pre-charging sub-circuit 8 a validation signal of predetermined duration $T_0$ (see FIG. 3, Graph D). This signal is received by a logic AND gate 12 which has a second input connected at 10 to the output of the comparator 6. As soon as the load 2 is switched on, the comparator 6 supplies a "high" level logic signal indicating that the voltage at the terminals of the load 2 is then less that Vref because of the starting of the charging of the capacitor C of the filter 3. The AND gate 12 then immediately triggers the conduction of the transistor 7 which then causes the voltage $V_{DD}$ to be applied to the capacitor C which then charges very rapidly. In fact, the resistance $R_{DSON}$ of the transistor 7 when it is conducting is very low with respect to $R_1$ and $R_2$ and the time constant $R_{DSON} \times C$ of the charging of the capacitor by the voltage source $V_{DD}$ is also low. Because of this low time constant, the capacitor C charges very rapidly as shown by the solid line in FIG. 3, Graph C, which shows the variation of the voltage $V_E$ on the input terminal E' of the circuit 11. The voltage Vref is reached at the point in time Toc.

If the charge 2 is not then short-circuited, the voltage $V_E$ will continue to increase, which causes the output of the comparator 6 to switch over to the low state. The AND gate 12 cuts off and the transistor 7 stops conducting. The charging of the capacitor C of the filter 3 continues under the effect of the voltage +Vbat alone with the time constant of the filter 3 as shown as the solid line in Graph C.

The output of the comparator 6 is connected to an input terminal 13 of the control unit. Thus from the point in time Toc the control unit receives a "low" signal from the comparator representative of the absence of a short-circuit of the load 2.

If the load 2 is in a short-circuited state when the load 2 is switched on, the voltage at E' at the point in time Toc will not continue to increase as shown by a solid line in the Graph C but will decrease until it drops below the value Vref again, because the voltage +Vbat is then short-circuited at the input of the filter 3. This decrease causes the output of the comparator to switch over to the high state and therefore puts the transistor 7 back into conduction which recharges the capacitor C to the voltage Vref, causing another switchover of the comparator etc... In FIG. 3, Graph E shows the switchovers of the comparator between the points in time Toc and $T_O$, these switchovers producing a regulation of the voltage $V_E$ then decreases because of the discharging of the capacitor C which is no longer charged either by the source $V_{DD}$ or by the source +Vbat because of the short-circuiting of the load 2. The output of the comparator then returns in a stable way to the high state to indicate the short-circuit of the load to the control unit 4.

According to one embodiment of the present invention, for example, the value of the duration $T_O$ of the validation pulse is set at 2 μs. Thus by means of the present invention, the control unit is informed of the short-circuit of the load at the end of 2 μs, compared with a duration of T in the order of 200 μs of the corresponding delay for the circuit of the prior art shown in FIG. 1.

An important advantageous characteristic of the circuit according to the present invention depends on the production by the control unit of the validation pulse of duration $T_O$ (FIG. 3, Graph D). The latter delays the production by the comparator of a signal representative of a state of short-circuit of the load by $T_O$. The value of $T_O$ is chosen such that it is longer than Toc (FIG. 3, Graph C), the time required for the charging of the capacitor C by the source $V_{DD}$ to reach the value Vref. Now Toc is a function or the capacitor C of the filter 3 external to the circuit 11. This filter 3 must be able to be adapted to modifications of the load of the actuator to be monitored, without this resulting in a modification of the circuit 11. Such modifications can result, for example, from a technological development of the actuator incorporating this load or from a reduction in the sensitivity of the short-circuit detection device to induced interference, such modifications normally resulting from the development of products in time through the efforts of their designers. By suitably choosing $T_O$ in such a way that $T_O$ remains longer than Toc, whatever the foreseeable development of the actuator and of the associated filter may be, the characteristics of this circuit 11 are fixed and this circuit can subsequently be adapted to the foreseeable modifications of the filter. The characteristics of the short-circuit detection device of the control circuit according to the present invention are thus rendered independent of subsequent developments of the filter.

The mean of pre-charging the capacitor C built into the circuit can easily be integrated at a low cost because they require the integration of only one logic gate and one MOS transistor.

Because the time period $T_O$ to be masked is extremely short with the circuit according to the present invention, it is possible to almost completely dispense with the masking logic described previously, which logic can contain several hundred MOS transistors. The saving in area for the integrated circuit is therefore considerable.

The safety and reliability of the control circuit according to the present invention are greatly improved with respect to those of the prior art circuit in FIG. 1, because the response time of the short-circuit detection device is reduced to very small values, much less than the critical value of 100 μs mentioned above.

By way of example, for an implementation of the present invention in a control circuit for an electromechanical valve to cut off the supply of fuel, the following values have been selected for certain parameters of the circuit:

$+V_{bat} = 12$ volts;

$+V_{DD}$ 5 volts;

$C = 10$ nF;

$R_1 = 47 k\Omega$;

$R_2 = 19 k\Omega$.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall b interpreted as illustrative and not in a limiting sense.

What is claimed is:

1. A circuit for controlling the power supply of an electrical load, having a device for detecting a short-circuit of the load by comparison of a reference voltage with a voltage sampled at terminals of the load and filtered in a capacitive filter connected thereto, comprising: means for pre-charging a capacitor of the filter in order to initially establish on an output of this capacitor a voltage substantially equal to the reference voltage, the electrical load being then connected to a supply voltage by a switching means, the time constant of the charging of the capacitor by the means for pre-charging being low with respect to that which corresponds to the charging of the capacitor by a supply voltage of the load alone, the means for pre-charging having a connecting transistor for connecting the capacitor of the filter to a precharging voltage source that is separate from the supply voltage and a logic sub-circuit for triggering the conduction of the connecting transistor when the load is switched on;

first and second inputs of a comparator respectively supplied by a source of reference voltage Vref, and by an output voltage, $V_E$, of the filter, and the logic sub-circuit having a logic AND gate having two inputs respectively connected to an output of the comparator and to a source of a validation signal of predetermined duration, $T_O$, an output of the AND gate being connected to a terminal controlling the conduction of the connection transistor, the output of the comparator supplying a signal representative of a state of short-circuit of the load when the output voltage of the filter remains below Vref at the end of the validation signal, $T_O$.

2. The circuit according to claim 1, wherein a control unit is connected to a control terminal of a control transistor which is the switching means for controlling the flow of a current between a positive terminal of the supply voltage, +Vbat, and the load, this control unit also being connected to the second input of the AND gate of the logic subcircuit, in order to supply to the control terminal of the control transistor a signal for putting that transistor into conduction and, simultaneously, a validation signal to the second input of the AND gate of the logic sub-circuit.

3. The circuit according to claim 2, wherein the control unit, the comparator, the connection transistor and the logic sub-circuit controlling the connection transistor constitute a single integrated circuit, the capacitive filter being external to this integrated circuit.

4. The circuit according to claim 1, wherein the duration, $T_O$, of the validation signal, starting from the switching on of the load is longer than the duration, Toc, of the charging of the capacitor to the reference voltage Vref, when this capacitor is connected by the connection transistor to the pre-charging voltage source.

5. The circuit according to claim 1, wherein the capacitive filter is a low pass RC filter having said capacitor and a first resistor in parallel between ground of the circuit and a terminal of a second resistor whose other terminal is connected to one terminal of the load, the other terminal of the load being connected to ground.

6. The circuit according to claim 1, wherein the load is an inductive load forming part of an actuator.

7. A circuit for controlling the power supply of an electrical load, having a device for detecting a short-circuit of the load by comparison of a reference voltage with a voltage sampled at terminals of the load and filtered in a capacitive filter connected thereto, comprising: means for pre-charging a capacitor of the filter in order to initially establish on an output of this capacitor a voltage substantially equal to the reference voltage, the means for pre-charging being actuated by a switching on of the electrical load, the electrical load being then connected to a supply voltage by a switching means the time constant of the charging of the capacitor by the means for pre-charging being low with respect to that which corresponds to the charging of the capacitor by a supply voltage of the load alone; the means for pre-charging having a connecting transistor for connecting the capacitor of the filter to a pre-charging voltage source and a logic sub-circuit for triggering the conduction of the connecting transistor when the load is switched on;

first and second inputs of a comparator respectively supplied by a source of reference voltage, Vref, and by an output voltage, $V_E$, of the filter, and the logic sub-circuit having a logic AND gate having two inputs respectively connected to an output of the comparator and to a source of a validation signal of predetermined duration, $T_O$, an output of the AND gate being connected to a terminal controlling the conduction of the connection transistor, the output of the comparator supplying a signal representative of a state of short-circuit of the load when the output voltage of the filter remains below Vref at the end of the validation signal, $T_O$.

8. The circuit according to claim 7, wherein a control unit is connected to a control terminal of a control transistor which is the switching means for controlling the flow of a current between a positive terminal of the supply source, +Vbat, and the load, this control unit also being connected to the second input of the AND gate of the logic subcircuit, in order to supply to the control terminal of the control transistor of a signal for putting that transistor into conduction and, simultaneously, a validation signal to the second input of the AND gate of the logic sub-circuit.

9. The circuit according to claim 8, wherein the control unit, the comparator, the connection transistor and the logic sub-circuit controlling the connection transistor constitute a single integrated circuit, the capacitive filter being external to this integrated circuit.

10. The circuit according to claim 7, wherein the duration, $T_O$, of the validation signal, starting from the switching on of the load is longer than the duration, Toc, of the charging of the capacitor to the reference voltage $V_{ref}$, when this capacitor is connected by the connection transistor to the pre-charging voltage source.

11. The circuit according to claim 7, wherein the capacitive filter is a low pass RC filter having said capacitor and a first resistor in parallel between ground of the circuit and a terminal of a second resistor whose other terminal is connected to one terminal of the load, the other terminal of the load being connected to ground.

12. The circuit according to claim 7, wherein the load is an inductive load forming part of an actuator.

13. A circuit for controlling the power supply of an electrical load, having a device for detecting a short-circuit of the load by comparison of a reference voltage with a voltage sampled at terminals of the load and filtered in a capacitive filter connected thereto, comprising means for pre-charging a capacitor of the filter in order to initially establish on an output of this capacitor a voltage substantially equal to the reference voltage, the means for pre-charging being actuated by a switching on of the electrical load, the electrical load being then connected to a supply voltage by a switching means, the time constant of the charging of the capacitor by the means for pre-charging being low with respect to that which corresponds to the charging of the capacitor by a supply voltage of the load alone; the means for precharging having a connecting transistor for connecting the capacitor of the filter to a pre-charging voltage source and a logic sub-circuit for triggering the conduction of the connecting transistor when the load is switched on; first and second inputs of a comparator respectively supplied by a source of reference voltage, Vref, and by an output voltage, $V_E$, of the filter, the logic sub-circuit having a logic AND gate having two inputs respectively connected to an output of the comparator and to a source of a validation signal of predetermined duration, $T_O$, an output of the AND gate being connected to a terminal controlling the conduction of the connection transistor, the output of the comparator supplying a signal representative of a state of short-circuit of the load when the output voltage of the filter remains below Vref at the end of the validation signal, $T_O$; and a control unit connected to a control terminal of a control transistor for controlling the flow of a current between a positive terminal of the supply voltage, +Vbat, and the load, this control unit also being connected to the second input of the AND gate of the logic sub-circuit, in order to supply to the control terminal of the control transistor a signal for putting that transistor into conduction and, simultaneously, a validation signal to the second input of the AND gate of the logic sub-circuit.

14. The circuit according to claim 13, wherein the control unit, the comparator, the connection transistor and the logic sub-circuit controlling the connection transistor constitute a single integrated circuit, the capacitive filter being external to this integrated circuit.

15. The circuit according to claim 13, wherein the duration, $T_O$, of the validation signal, starting from the switching on of the load is longer than the duration, Toc, of the charging of the capacitor to the reference voltage Vref, when this capacitor is connected by the connection transistor to the pre-charging voltage source.

16. The circuit according to claim 13, wherein the capacitive filter is a low pass RC filter having said capacitor and a first resistor in parallel between ground of the circuit and a terminal of a second resistor whose other terminal is connected to one terminal of the load, the other terminal of the load being connected to ground.

17. The circuit according to claim 13, wherein the load is an inductive load forming part of an actuator.

* * * * *